United States Patent
Kirby et al.

(10) Patent No.: US 10,308,505 B1
(45) Date of Patent: Jun. 4, 2019

(54) METHOD AND APPARATUS FOR THE MONOLITHIC ENCAPSULATION OF A MICRO-SCALE INERTIAL NAVIGATION SENSOR SUITE

(71) Applicant: HRL LABORATORIES LLC, Malibu, CA (US)

(72) Inventors: Deborah J. Kirby, Calabasas, CA (US); Raviv Perahia, Calabasas, CA (US); Hung Nguyen, Los Angeles, CA (US); Frederic P. Stratton, Beverly Hills, CA (US); David T. Chang, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 24 days.

(21) Appl. No.: 14/456,808

(22) Filed: Aug. 11, 2014

(51) Int. Cl.
 *B81B 3/00* (2006.01)
 *B81C 1/00* (2006.01)
 *G01C 21/18* (2006.01)

(52) U.S. Cl.
 CPC ............ *B81C 1/00285* (2013.01); *B81B 3/00* (2013.01); *B81B 3/0021* (2013.01); *B81B 2201/0235* (2013.01); *B81B 2201/0242* (2013.01); *B81C 2203/0172* (2013.01); *G01C 21/18* (2013.01)

(58) Field of Classification Search
 None
 See application file for complete search history.

(56) References Cited

U.S. PATENT DOCUMENTS

| | | | |
|---|---|---|---|
| 392,650 | A | 11/1888 | Watrous |
| 2,487,165 | A | 11/1949 | Miller |
| 3,390,287 | A | 6/1968 | Sonderegger |
| 3,766,616 | A | 10/1973 | Staudte |
| 4,426,769 | A | 1/1984 | Grabbe |
| 4,442,574 | A | 4/1984 | Wanuga et al. |
| 4,618,262 | A | 10/1986 | Maydan et al. |
| 4,655,081 | A | 4/1987 | Burdess |
| 4,870,313 | A | 9/1989 | Hirama et al. |
| 4,898,031 | A | 2/1990 | Oikawa et al. |

(Continued)

FOREIGN PATENT DOCUMENTS

| | | |
|---|---|---|
| DE | 4442033 | 5/1996 |
| DE | 19719601 | 11/1998 |

(Continued)

OTHER PUBLICATIONS

From U.S. Appl. No. 15/083,190 (unpublished; non publication request filed), Office Action dated Feb. 1, 2018.

(Continued)

*Primary Examiner* — Marc Anthony Armand
*Assistant Examiner* — Quinton A Brasfield
(74) *Attorney, Agent, or Firm* — Ladas & Parry

(57) ABSTRACT

A device preferably for use in an inertial navigation system the device having a single IC wafer; a plurality of sensors bonded to bond regions on said single IC wafer, at least one of said bond regions including an opening therein in gaseous communication with a pressure chamber associated with at least one of the plurality of said sensors; and a plurality of caps encapsulating said plurality of sensors, at least one of said plurality of caps forming at least a portion of said pressure chamber. A method of making the device is also disclosed.

27 Claims, 3 Drawing Sheets

(56) References Cited

U.S. PATENT DOCUMENTS

| | | |
|---|---|---|
| 4,944,836 A | 7/1990 | Beyer et al. |
| 5,203,208 A | 4/1993 | Bernstein |
| 5,226,321 A | 7/1993 | Varnham et al. |
| 5,260,596 A | 11/1993 | Dunn et al. |
| 5,421,312 A | 6/1995 | Dawson |
| 5,480,747 A | 1/1996 | Vasudev |
| 5,530,408 A | 6/1996 | Vig et al. |
| 5,552,016 A | 9/1996 | Ghanayem |
| 5,578,976 A | 11/1996 | Yao et al. |
| 5,589,724 A | 12/1996 | Satoh et al. |
| 5,604,312 A | 2/1997 | Lutz |
| 5,605,490 A | 2/1997 | Laffey et al. |
| 5,644,139 A | 7/1997 | Allen et al. |
| 5,646,346 A | 7/1997 | Okada |
| 5,648,849 A | 7/1997 | Canteloup et al. |
| 5,658,418 A | 8/1997 | Coronel et al. |
| 5,665,915 A | 9/1997 | Kobayashi et al. |
| 5,666,706 A | 9/1997 | Tomita et al. |
| 5,668,057 A | 9/1997 | Eda et al. |
| 5,728,936 A | 3/1998 | Lutz |
| 5,783,749 A | 7/1998 | Lee et al. |
| 5,894,090 A | 4/1999 | Tang et al. |
| 5,905,202 A | 5/1999 | Kubena et al. |
| 5,920,012 A | 7/1999 | Pinson |
| 5,928,532 A | 7/1999 | Koshimizu et al. |
| 5,942,445 A | 8/1999 | Kato et al. |
| 5,959,206 A | 9/1999 | Ryrko |
| 5,981,392 A | 11/1999 | Oishi |
| 5,987,985 A | 11/1999 | Okada |
| 6,009,751 A | 1/2000 | Ljung |
| 6,044,705 A | 4/2000 | Neukermans et al. |
| 6,049,702 A | 4/2000 | Tham et al. |
| 6,081,334 A | 6/2000 | Grimbergen et al. |
| 6,089,088 A | 7/2000 | Charvet |
| 6,094,985 A | 8/2000 | Kapels et al. |
| 6,114,801 A | 9/2000 | Tanaka et al. |
| 6,145,380 A | 11/2000 | MacGugan et al. |
| 6,151,964 A | 11/2000 | Nakajima |
| 6,155,115 A | 12/2000 | Ljung |
| 6,164,134 A | 12/2000 | Cargille |
| 6,182,352 B1 | 2/2001 | Deschenes et al. |
| 6,196,059 B1 | 3/2001 | Kosslinger |
| 6,204,737 B1 | 3/2001 | Ella |
| 6,207,008 B1 | 3/2001 | Kijima |
| 6,236,145 B1 | 5/2001 | Biernacki |
| 6,250,157 B1 | 6/2001 | Touge |
| 6,263,552 B1 | 7/2001 | Takeuchi et al. |
| 6,282,958 B1 | 9/2001 | Fell et al. |
| 6,289,733 B1 | 9/2001 | Challoner et al. |
| 6,297,064 B1 | 10/2001 | Koshimizu |
| 6,349,597 B1 | 2/2002 | Folkmer et al. |
| 6,367,326 B1 | 4/2002 | Okada |
| 6,367,786 B1 | 4/2002 | Gutierrez et al. |
| 6,413,682 B1 | 7/2002 | Shibano et al. |
| 6,417,925 B1 | 7/2002 | Naya |
| 6,424,418 B2 | 7/2002 | Kawabata et al. |
| 6,426,296 B1 | 7/2002 | Okojie |
| 6,432,824 B2 | 8/2002 | Yanagisawa |
| 6,481,284 B2 | 11/2002 | Geen et al. |
| 6,481,285 B1 | 11/2002 | Shkel et al. |
| 6,492,195 B2 | 12/2002 | Nakanishi |
| 6,513,380 B2 | 2/2003 | Reeds et al. |
| 6,514,767 B1 | 2/2003 | Natan |
| 6,515,278 B2 | 2/2003 | Wine et al. |
| 6,571,629 B1 | 6/2003 | Kipp |
| 6,584,845 B1 | 7/2003 | Gutierrez et al. |
| 6,614,529 B1 | 9/2003 | Tang |
| 6,621,158 B2 | 9/2003 | Martin et al. |
| 6,627,067 B1 | 9/2003 | Branton et al. |
| 6,628,177 B2 | 9/2003 | Clark et al. |
| 6,629,460 B2 | 10/2003 | Challoner |
| 6,651,027 B2 | 11/2003 | McCall et al. |
| 6,662,656 B2 | 12/2003 | Jeanroy |
| 6,686,807 B1 | 2/2004 | Giousouf et al. |
| 6,710,681 B2 | 3/2004 | Figueredo et al. |
| 6,715,352 B2 | 4/2004 | Tracy |
| 6,744,335 B2 | 6/2004 | Ryhanen |
| 6,750,728 B2 | 6/2004 | Takahashi et al. |
| 6,756,304 B1 | 6/2004 | Robert |
| 6,768,396 B2 | 7/2004 | Klee et al. |
| 6,796,179 B2 | 9/2004 | Bae et al. |
| 6,806,557 B2 | 10/2004 | Ding |
| 6,815,228 B2 | 11/2004 | Usui et al. |
| 6,856,217 B1 | 2/2005 | Clark et al. |
| 6,862,398 B2 | 3/2005 | Elkind et al. |
| 6,883,374 B2 | 4/2005 | Fell et al. |
| 6,915,215 B2 | 7/2005 | Closkey et al. |
| 6,933,164 B2 | 8/2005 | Kubena |
| 6,943,484 B2 | 9/2005 | Clark et al. |
| 6,985,051 B2 | 1/2006 | Nguyen et al. |
| 7,040,163 B2 | 5/2006 | Shcheglov |
| 7,057,331 B2 | 6/2006 | Shimodaira et al. |
| 7,118,657 B2 | 10/2006 | Goloychenko et al. |
| 7,152,290 B2 | 12/2006 | Junhua et al. |
| 7,168,318 B2 | 1/2007 | Challoner et al. |
| 7,211,933 B2 | 5/2007 | Kawakubo |
| 7,224,245 B2 | 5/2007 | Song et al. |
| 7,232,700 B1 | 6/2007 | Kubena |
| 7,234,214 B2 | 6/2007 | Xu |
| 7,237,315 B2 | 7/2007 | Kubena |
| 7,281,425 B2 | 10/2007 | Chikovani |
| 7,295,088 B2 | 11/2007 | Nguyen et al. |
| 7,317,354 B2 | 1/2008 | Lee |
| 7,404,325 B2 | 7/2008 | Delevoye |
| 7,446,628 B2 | 11/2008 | Morris, III |
| 7,459,099 B2 | 12/2008 | Kubena et al. |
| 7,459,992 B2 | 12/2008 | Matsuda et al. |
| 7,479,846 B2 | 1/2009 | Inoue et al. |
| 7,490,390 B2 | 2/2009 | Kawakubo et al. |
| 7,543,496 B2 | 6/2009 | Ayazi et al. |
| 7,551,054 B2 | 6/2009 | Mizuno et al. |
| 7,555,824 B2 | 7/2009 | Chang |
| 7,557,493 B2 | 7/2009 | Fujimoto |
| 7,559,130 B2 | 7/2009 | Kubena et al. |
| 7,564,177 B2 | 7/2009 | Yoshimatsu et al. |
| 7,579,748 B2 | 8/2009 | Kuroda |
| 7,579,926 B2 | 8/2009 | Jhung |
| 7,581,443 B2 | 9/2009 | Kubena |
| 7,663,196 B2 | 2/2010 | Liu et al. |
| 7,671,427 B2 | 3/2010 | Kim et al. |
| 7,675,224 B2 | 3/2010 | Tanaya |
| 7,750,535 B2 | 7/2010 | Kubena et al. |
| 7,757,393 B2 | 7/2010 | Ayazi et al. |
| 7,791,431 B2 | 9/2010 | Piazza et al. |
| 7,802,356 B1 | 9/2010 | Chang |
| 7,830,074 B2 | 11/2010 | Kubena |
| 7,872,548 B2 | 1/2011 | Nishihara et al. |
| 7,884,930 B2 | 2/2011 | Kirby |
| 7,895,892 B2 | 3/2011 | Aigner |
| 7,994,877 B1 | 8/2011 | Kubena |
| 8,138,016 B2 | 3/2012 | Chang |
| 8,151,640 B1 | 4/2012 | Kubena |
| 8,176,607 B1 | 5/2012 | Kubena |
| 8,305,154 B1 | 11/2012 | Kubena |
| 8,522,612 B1 | 9/2013 | Kubena |
| 8,569,937 B1 * | 10/2013 | Kubena ............... H03H 9/1021 310/309 |
| 8,765,615 B1 | 7/2014 | Chang |
| 8,766,745 B1 | 7/2014 | Kubena |
| 9,038,459 B1 | 5/2015 | Kubena |
| 9,404,748 B2 | 8/2016 | Perahia |
| 2002/0066317 A1 | 6/2002 | Lin |
| 2002/0072246 A1 | 6/2002 | Goo et al. |
| 2002/0074947 A1 | 6/2002 | Tsukamoto |
| 2003/0003608 A1 | 1/2003 | Arikado et al. |
| 2003/0010123 A1 | 1/2003 | Malvern et al. |
| 2003/0029238 A1 | 2/2003 | Challoner |
| 2003/0196490 A1 | 10/2003 | Cardarelli |
| 2003/0205948 A1 | 11/2003 | Lin et al. |
| 2004/0055380 A1 | 3/2004 | Shcheglov et al. |
| 2004/0065864 A1 | 4/2004 | Vogt et al. |
| 2004/0189311 A1 | 9/2004 | Glezer |
| 2004/0211052 A1 | 10/2004 | Kubena et al. |

(56) References Cited

U.S. PATENT DOCUMENTS

| | | | |
|---|---|---|---|
| 2004/0219700 A1* | 11/2004 | Silverbrook | B29C 43/36 438/22 |
| 2004/0239341 A1 | 12/2004 | Aoyagi et al. | |
| 2005/0034822 A1 | 2/2005 | Kim et al. | |
| 2005/0062368 A1 | 3/2005 | Hirasawa | |
| 2005/0093659 A1 | 5/2005 | Larson et al. | |
| 2005/0156309 A1 | 7/2005 | Fujii | |
| 2005/0172714 A1 | 8/2005 | Challoner | |
| 2005/0260792 A1 | 11/2005 | Patel | |
| 2006/0016065 A1 | 1/2006 | Nagaura | |
| 2006/0022556 A1 | 2/2006 | Bail et al. | |
| 2006/0055479 A1 | 3/2006 | Okazaki et al. | |
| 2006/0066419 A1 | 3/2006 | Iwaki et al. | |
| 2006/0139121 A1 | 6/2006 | Jhung | |
| 2006/0144142 A1* | 7/2006 | Gogoi | B81B 7/0041 73/504.02 |
| 2006/0197619 A1 | 9/2006 | Oishi et al. | |
| 2006/0213266 A1 | 9/2006 | French et al. | |
| 2006/0252906 A1 | 11/2006 | Godschalx et al. | |
| 2007/0017287 A1 | 1/2007 | Kubena | |
| 2007/0034005 A1 | 2/2007 | Acar et al. | |
| 2007/0205839 A1 | 9/2007 | Kubena et al. | |
| 2007/0220971 A1 | 9/2007 | Ayazi et al. | |
| 2007/0240508 A1 | 10/2007 | Watson | |
| 2008/0034575 A1 | 2/2008 | Chang et al. | |
| 2008/0074661 A1 | 3/2008 | Zhang | |
| 2008/0096313 A1 | 4/2008 | Patel | |
| 2008/0148846 A1 | 6/2008 | Whelan et al. | |
| 2009/0146527 A1 | 6/2009 | Lee | |
| 2009/0189294 A1 | 7/2009 | Chang | |
| 2010/0000324 A1 | 1/2010 | Yoshikawa et al. | |
| 2010/0020311 A1 | 1/2010 | Kirby | |
| 2010/0024546 A1 | 2/2010 | Challoner | |
| 2010/0148803 A1 | 6/2010 | Ohnishi et al. | |
| 2010/0314969 A1 | 12/2010 | Gaidarzhy et al. | |
| 2011/0107838 A1 | 5/2011 | Suijlen et al. | |
| 2011/0227173 A1* | 9/2011 | Seppala | B81C 1/0023 257/415 |
| 2012/0000288 A1 | 1/2012 | Matsuura et al. | |
| 2012/0049300 A1* | 3/2012 | Yamaguchi | G01L 19/147 257/417 |
| 2012/0137774 A1 | 6/2012 | Judy | |
| 2012/0181900 A1* | 7/2012 | Puccio | G01L 9/0022 310/338 |
| 2012/0212109 A1 | 8/2012 | Yamazaki et al. | |
| 2012/0266682 A1 | 10/2012 | Torashima et al. | |
| 2013/0104653 A1 | 5/2013 | Bernstein | |
| 2013/0214461 A1 | 8/2013 | Shkel et al. | |
| 2014/0033814 A1* | 2/2014 | Wen | G01L 19/14 257/419 |
| 2014/0183729 A1* | 7/2014 | Bowles | H01L 23/49811 257/737 |

FOREIGN PATENT DOCUMENTS

| | | |
|---|---|---|
| EP | 0461761 | 12/1991 |
| EP | 0531985 | 3/1993 |
| EP | 1055908 | 11/2000 |
| EP | 0971208 | 12/2000 |
| JP | 57-091017 | 6/1982 |
| JP | 401129517 | 5/1989 |
| JP | 04322507 | 11/1992 |
| JP | 05286142 | 11/1993 |
| JP | 06232678 | 8/1994 |
| JP | 6-318533 | 11/1994 |
| JP | 08330878 | 12/1996 |
| JP | 9-247025 | 9/1997 |
| JP | 2003-318685 | 11/2003 |
| JP | 2005-180921 | 7/2005 |
| JP | 2006-352487 | 12/2006 |
| KR | 10-2001-0110428 | 12/2001 |
| WO | 84/00082 | 1/1984 |
| WO | 96/38710 | 12/1996 |
| WO | 98/15799 | 4/1998 |
| WO | 00/68640 | 11/2000 |
| WO | 01/44823 | 6/2001 |
| WO | 01/74708 | 10/2001 |
| WO | 02/12873 | 2/2002 |
| WO | 2005/121769 | 12/2005 |
| WO | 2006/010206 | 2/2006 |
| WO | 2006/103439 | 10/2006 |

OTHER PUBLICATIONS

From U.S. Appl. No. 15/083,190 (unpublished; non publication request filed), Office Action dated Dec. 15, 2017.
U.S. Appl. No. 10/426,931, Kubena, filed Apr. 30, 2003.
U.S. Appl. No. 11/458,911, Kubena, filed Jul. 20, 2006.
U.S. Appl. No. 11/502,336, Chang, filed Aug. 9, 2006.
U.S. Appl. No. 11/818,797, Kirby, filed Jun. 14, 2007.
U.S. Appl. No. 11/881,461, Kubena, filed Jul. 27, 2007.
U.S. Appl. No. 12/026,486, Kubena, filed Feb. 5, 2008.
U.S. Appl. No. 12/027, 247, Kubena, filed Feb. 6, 2008.
U.S. Appl. No. 12/034,852, Chang, filed Feb. 21, 2008.
U.S. Appl. No. 12/268,309, Kubena, filed Nov. 10, 2008.
U.S. Appl. No. 12/488,784, Kubena, filed Jun. 22, 2009.
U.S. Appl. No. 13/410,998, Kubena, filed Mar. 2, 2012.
U.S. Appl. No. 13/930,769, Perahia, filed Jun. 28, 2013.
U.S. Appl. No. 14/024,506, Kirby, filed Sep. 11, 2013.
U.S. Appl. No. 14/456,808, Kirby, filed Aug. 11, 2014.
U.S. Appl. No. 15/083,190, Perahia, filed Mar. 28, 2016.
From U.S. Appl. No. 13/930,769 (now U.S. Pat. No. 9,404,748), Notice of Allowance dated Apr. 6, 2016.
From U.S. Appl. No. 13/930,769 (now U.S. Pat. No. 9,404,748), Office Action dated Mar. 10, 2016.
From U.S. Appl. No. 13/930,769 (now U.S. Pat. No. 9,404,748), Office Action dated Nov. 4, 2015.
From U.S. Appl. No. 13/930,769 (now U.S. Pat. No. 9,404,748), Office Action dated Jul. 20, 2015.
From U.S. Appl. No. 14/024,506 (filed Sep. 11, 2013, unpublished, non publication request filed), Notice of Allowance dated Nov. 8, 2016.
From U.S. Appl. No. 14/024,506 (filed Sep. 11, 2013, unpublished, non publication request filed), Office Action dated Jul. 19, 2016.
From U.S. Appl. No. 14/024,506 (filed Sep. 11, 2013, unpublished, non publication request filed), Office Action dated Mar. 23, 2016.
From U.S. Appl. No. 14/024,506 (filed Sep. 11, 2013, unpublished, non publication request filed), Office Action dated Nov. 13, 2015.
Aaltonen, T., et al., "ALD of Rhodium thin films from Rh(acac)$_3$ and Oxygen," Electrochemical and Solid-State Lettersm, 8, (8) C99-C101 (2005).
Abe, Takashi, et al., "One-chip multichannel quartz crystal microbalance (QCM) fabricated by Deep RIE," Sensors and Actuators, vol. 82, pp. 139-143 (2000).
Aoyagi, et al., "Development of Surface Micromachinable Capacitive Accelerometer Using Fringe Electrical Field," Proc. IEEE Transducers 2003, pp. 1383-1386 (2003).
Barbour et al., "Micromechanical Silicon Instrument and Systems Development at Draper Laboratory," AIAA Guidance Navigation and Control Conference, 1996, Paper No. 96-3709 (20 pages).
Blevins, R.D., "Formulas for natural frequency and mode shape", Krieger Publishing Company, pp. 298-299, 2001.
Burdess et al., "The Theory of a Piezoelectric Disc Gyroscope", Jul. 1986, IEEE vol. AES 22, No. 4; p. 410-418.
Chan, M.L., "Micromachined Polycrystalline Diamond Hemispherical Shell Resonators", Solid-State Sensors, Actuators, and Microsystems Workshop, Hilton Head Island, South Carolina, Jun. 3-7, 2012, p. 355-358.
Cho, J. et. al, "A High-Q Birdbath Resonator Gyroscope (BRG)," IEEE Transducers 2013, Barcelona, Spain, Jun. 16-20, 2013, pp. 1847-1850.
Cleland, A.N., et al., "Fabrication of High Frequency Nanometer Scale Mechanical Resonators From Bulk Si Crystals," Applied Physics Letters, 69 (18), Oct. 28, 1996.
Evoy, S., et al., "Temperature-dependent internal friction in silicon nanoelectromechanical systems," Applied Physics Letters, vol. 77, No. 15, pp. 2397-2399 (Oct. 9, 2000).

(56) References Cited

OTHER PUBLICATIONS

Freidht, J.-M. and Carry, E., "Introduction to the quartz tuning fork", American Journal of Physics 75, 415 (2007), pp. 415-422 (9 pages).

Fujita et al., "Disk-shaped bulk micromachined gyroscope with vacuum sealing," Sensors and Actuators, vol. 82, May 2000, pp. 198-204.

Greer, J.A., et al., "Properties of SAW resonators fabricated on quartz substrates of various qualities," Ultrasonics Symposium, 1994 IEEE, vol. 1, Nov. 1-4, 1994, pp. 31-36.

Griffiths, D. J. (1999). Introduction to Electrodynamics, Third Edition, Upper Saddle River: Prentice Hall, pp. 179-196 (22 pages).

Heidari, et al., "Micromachined Polycrystalline Diamond Hemispherical Shell Resonators," Transducers 2013, Barcelona, Spain, Jun. 16-20, 2013, pp. 2415-2418.

Johnson et al., "Surface Micromachined Angular Rate Sensor," A1995 SAE Conference, Paper No. 950538, pp. 77-83 (9 pages).

Kuhns, Richard Michael, Design and Fabrication of a Micromechanical Gyroscope Thesis, Jun. 17, 1996, Pertinent Section: Chapter 5.

Lee, Kwan H., "Cooling and control of a cavity optoelectromechanical system" Phys. Rev. Lett., vol. 104, 123604 2010 (4 pages).

Lin, J. W, et al., "A Robust High-Q Micromachined RF Inductor for RFIC Applications," IEEE Transactions on Electronic Devices, vol. 52, No. 7, pp. 1489-1496 (Jul. 2005).

Park, K.J., et al., "Selective area atomic layer deposition of rhodium and effective work function characterization in capacitor structures," Applied Physics Letters 89, 043111 (2006), 3 pages.

Perahia, R., et al. "Electric gradient force drive mechanism for novel microscale all-dielectric gyroscope," Micro Electro Mechanical Systems (MEMS), 2014 IEEE 27th International Conference on Jan. 26-30, 2014.

Putty et al., "A Micromachined Vibrating Ring Gyroscope," Solid State Sensor and Actuator Workshop, Transducer Research Foundation, Hilton Head, 1994, pp. 213-220.

Senkal, D., "Titania silicate/fused Quartz Glassblowing for 3-D Fabrication of Low Internal Wineglass Micro-structures" Solid-State Sensors, Actuators, and Microsystems Workshop Hilton Head Island, South Carolina, Jun. 3-7, 2012, p. 267-270.

Shao, P., "Wineglass on-a-chip" Solid-State Sensors, Actuators, and Microsystems Workshop, Hilton Head Island, South Carolina, Jun. 3-7, 2012, pp. 275-278.

Sirbuly, Donald J. et al., Multifunctional Nanowire Evanescent Wave Optical Sensors, Advanced Materials, 2007 (published online: Dec. 5, 2006), 19, pp. 61-66.

Skulski et al., "Planar resonator sensor for moisture measurements", Microwaves and Radar, 1998, MIKON '98, 12th International Conf., vol. 3, May 20-22, 1998, pp. 692-695.

Sorenson, L.D., et al., "Effect of Thickness Anisotropy on Degenerate Modes in Oxide Micro-Hemispherical Shell Resonators," Proc. IEEE MEMS 2013, Taipei, Taiwan, Jan. 20-24, 2013, pp. 169-172.

Tang et al., "A Packaged Silicon MEMS Vibratory Gyroscope for Microspacecraft," Proceedings IEEE, 10th Annual Int. Workshop on MEMS, Japan, 1997, pp. 500-505.

Tang et al., "Silicon Bulk Micromachined Vibratory Gyroscope," Jet Propulsion Lab, Jun. 2, 1996 (6 pages).

Unterreithmeier, Q.P., "Universal transduction scheme for nanomechanical systems based on dielectric forces," Nature, vol. 458, pp. 1001-1004 (Apr. 2009).

White, Lan M., et al., Increasing the Enhancement of SERS with Dielectric Microsphere Resonators, Spectroscopy-Eugene, Apr. 2006 (5 pages).

Wright et al., "The HRG Applied to a Satellite Attitude Reference System," Guidance and Control, AASAAS, 1994, vol. 86: pp. 55-67 (14 pages).

Yan, Fei, et al., "Surface-enhanced Raman scattering (SERS) detection for chemical and biological agents," IEEE Sensors Journal, vol. 5, No. 4, Aug. 2005 (7 pages).

Yazdi, N., et al. , "Micromachined Inertial Sensors," Proceedings of the IEEE, Vol. 86, No. 8, pp. 1640-1659 (Aug. 1998).

Zhiyong et al., "Ultra-Low Noise Charge Sensitive Amplifier for MEMS Gyroscope," 2009 Fifth International Conference on MEMS, NANO, and Smart Systems, 2009, pp. 29-32.

Zotov, S.A., Journal of Microelectromechanical Systems, vol. 21, No. 3, Jun. 2012, pp. 509-510.

\* cited by examiner

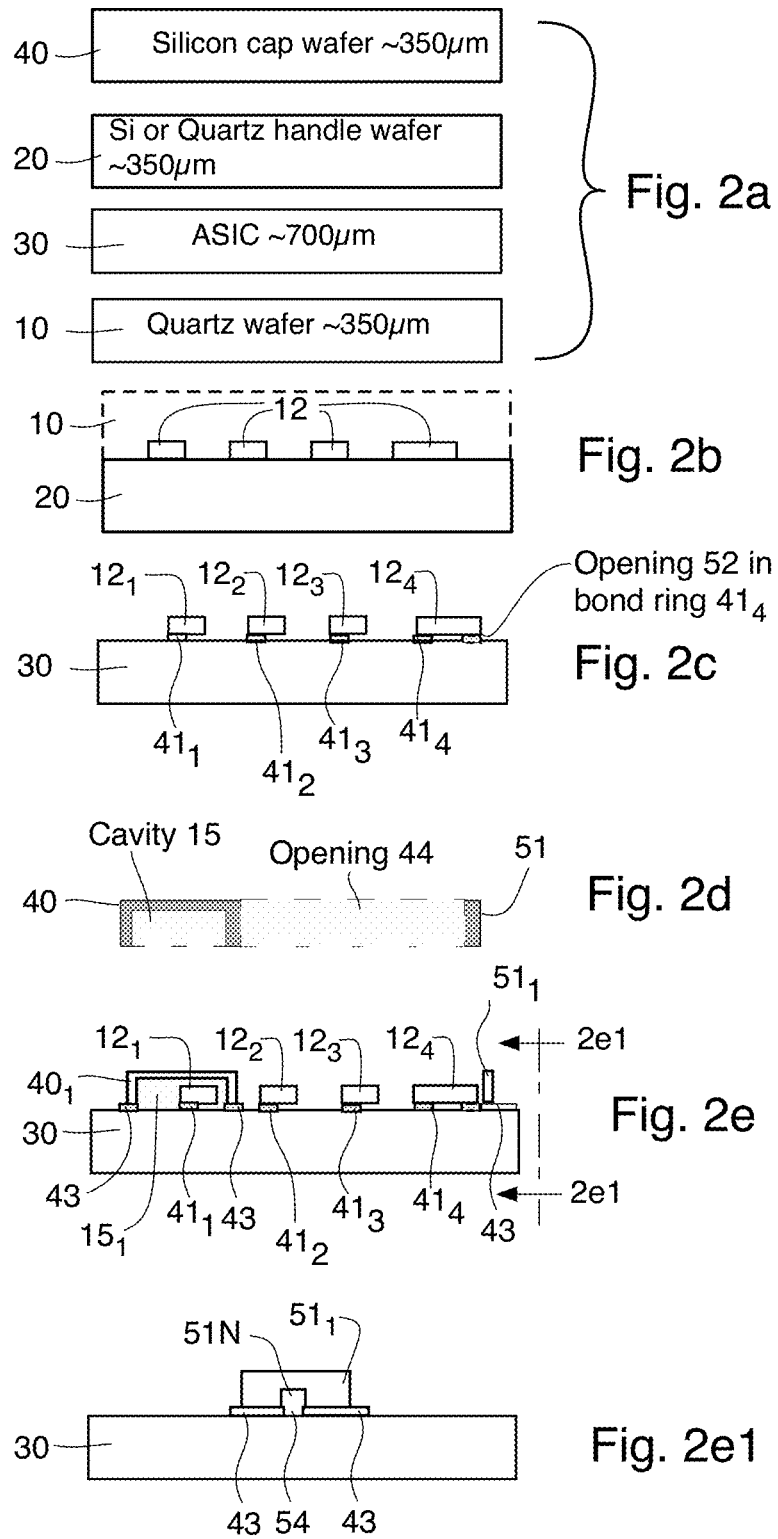

METHOD AND APPARATUS FOR THE MONOLITHIC ENCAPSULATION OF A MICRO-SCALE INERTIAL NAVIGATION SENSOR SUITE

CROSS REFERENCE TO RELATED APPLICATIONS AND PATENTS

This application is related to U.S. patent application Ser. No. 13/930,769 filed Jun. 28, 2013 and entitled "Electric Gradient Force Drive and Sense Mechanism for a Micro-Electromechanical-System Gyroscope", the disclosure of which is hereby incorporated herein by reference.

This application is also related to U.S. patent application Ser. No. 14/024,506 filed Sep. 11, 2013 and entitled "A Dielectric High Q MEMS Shell Gyro Structure", the disclosure of which is hereby incorporated herein by reference.

This disclosure takes advantage of techniques disclosed in U.S. Pat. No. 7,237,315 and therefore U.S. Pat. No. 7,237,315 is hereby incorporated herein by reference.

STATEMENT REGARDING FEDERALLY SPONSORED RESEARCH OR DEVELOPMENT

None

TECHNICAL FIELD

This invention describes an apparatus and method for monolithic encapsulation of a micro-scale quartz sensor suite to provide a highly integrated, highly stable inertial navigation system (INS).

BACKGROUND

An INS typically includes accelerometers and gyroscopes for rotation and acceleration detection. The accuracy of an INS is improved with inclusion of additional sensors such as magnetometers and pressure sensors. MEMs integrated INS's presently combine and align these individually packaged sensors within an outer package housing to form a complete INS. An INS comprised of a clock, gyroscope, accelerometer, pressure sensor and magnetometer; typically requires different environments for the individual sensors, leading to increased size, complexity and cost of the composite unit.

In this invention, we describe an approach for monolithic integration of such sensors at the wafer level, yielding a composite system that is compact, low cost and while maintaining high stability and accuracy. We propose to package a sensor suite monolithically, such that each sensor component is sealed within in its required environment (eg vacuum, nitrogen, under pressure etc), via a monolithic process. Furthermore, sensor alignment is completed lithographically, eliminating the need for post processing alignment.

BRIEF DESCRIPTION OF THE INVENTION

In one aspect the present invention provides a sensor suite for an inertial navigation system in which several sensors are monolithically formed on a single wafer and where each sensor is sealed under a unique pressure and/or a unique gaseous material.

In another aspect the present invention provides a device comprising: a single IC wafer; a plurality of sensors bonded to bond regions on said single IC wafer, at least one of said bond regions including an opening therein in gaseous communication with a pressure chamber associated with at least one of the plurality of said sensors; and a plurality of caps encapsulating said plurality of sensors, at least one of said plurality of caps forming at least a portion of said pressure chamber.

In still another aspect the present invention provides a method of making a device comprising the steps of: temporarily bonding a handle wafer with a wafer from which sensors and/or devices are to be formed; forming said sensors and/or devices at least in part from said wafer; adhering exposed surfaces of said sensors and/or devices to bond regions on an integrated circuit chip or wafer; removing the handle wafer from the sensors and/or devices; and encapsulating the sensors and/or devices with a plurality of caps, each cap encapsulating one or more of said sensors and/or devices with a unique environment.

BRIEF DESCRIPTION OF THE DRAWINGS

FIG. 1a is a side view schematic illustration of the monolithically formed INS showing sensor components sealed in individual environments and at specific required pressures, while

FIGS. 2a-2j are across view (taken along line 2-2 shown in FIG. 1b) showing the steps used in a method described herein to form a slightly modified embodiment of the monolithically formed INS depicted by FIG. 1a;

FIG. 2e1 is a side elevational view of the INS being formed at the step corresponding to FIG. 2e.

DETAILED DESCRIPTION

Figure 1A:
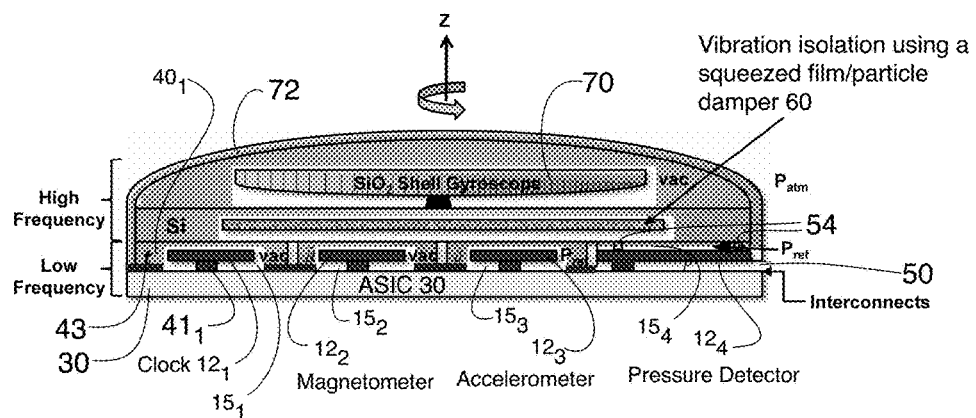

A schematic of the inertial navigation system (INS) is presented in FIG. 1a, in which components of the INS are preferably formed monolithically and then wafer bonded to enclose each sensor (or device) $12_1$-$12_4$ of the INS in individual environments with individual cavities $15_1$-$15_4$ using respective caps $40_1$-$40_4$. In this way, the size of the composite unit is reduced and the alignment of the sensors (or devices) $12_1$-$12_4$ within the system is also simplified since sensor alignment is achieved via lithographic wafer scale fabrication techniques and therefore post processing alignment can be eliminated. In order to discuss the construction of such an INS, the corresponding fabrication process flow is shown below in FIGS. 2a-2j. The sensors (or devices) are typically sensors (such as compasses, pressure detectors, magnetometers and/or accelerometers), but devices (such as electronic clocks) are sometimes also used in an INS and can be embodied in the INS using the same construction techniques as used with the sensors, as is described below.

Initially (see FIG. 2a) one begins with a quartz wafer 10, a quartz or silicon handle wafer 20, an Application Specific Integrated Circuit (ASIC) wafer 30 containing electronics and preferably as many silicon cap wafers $40_1$ . . . $40_N$ as there are planned monolithic sensors $12_1$ . . . $12_N$ to be formed from the quartz wafer 10. The embodiment of FIGS. 2a-2j has four sensors (or devices) three of which $12_1$ . . . $12_3$ are preferably totally encapsulated by an associated cap $40_1$ . . . $40_3$ in a hermetically sealed cavity $15_1$ . . . $15_3$ and one of which $12_4$ (a pressure detector) is partially encapsulated by cap $40_4$ and has an sealed cavity or pressure chamber $15_4$ associated with it for containing a gas at a reference pressure $P_{ref}$. The pressure detector $12_4$ detects a differential pressure across a diaphragm, one side of which is exposed to that reference pressure $P_{ref}$ and the other side of which is preferably exposed to ambient pressure via a channel 50. The number and types of sensors and devices may be varied as needed to the use of any of them is optional.

The suggested initial thicknesses of these elements are identified on FIG. 2a but these thicknesses can be varied as needed or desired.

The quartz wafer 10 is temporarily bonded to the quartz or silicon handle wafer 20 (the quartz wafer 10 is shown in dashed lines in FIG. 2b) using a temporary adhesive, for example wax, (not shown) or a temporary fusion bond, followed by thinning and patterning of the quartz wafer 10 to define individual quartz sensors and/or devices 12 from quartz wafer 10 which are thus temporarily adhered to the quartz or silicon handle wafer 20 by the aforementioned temporary adhesive or fusion bond (or other temporary bonding technique). The individual quartz sensors and/or devices 12 of FIG. 2b are individually numbered $12_1$-$12_4$ in the following figures. Four sensors and/or devices 12 are shown on FIG. 2b, but the number of sensors and/or devices 12 formed from the quartz wafer 10 may be varied as needed to accommodate the number needed in the sensor suite to be monolithically encapsulated.

Next the sensors and/or devices 12 are bonded to the ASIC wafer 30 at bond regions $41_1$-$41_3$ and at a ring bond $41_4$ preferably using a thermo-compression bond under vacuum. The temporary quartz or silicon handle wafer 20 is then preferably removed resulting in the structure depicted by FIG. 2c. One of the sensors is preferably a pressure sensor to sense ambient pressure and therefor an opening 52 in the bond ring $41_4$ is provided to allow pressure equalization for the pressure sensor, which in this embodiment is sensor $12_4$. See FIG. 1b.

Recall that there are preferably a number of silicon cap wafers 40 which is preferably less than or equal to the number of sensors to be encapsulated. If two sensors both require the same ambient conditions then they may potentially share a common sealed cavity 15. In this embodiment four sensors are encapsulated individually and thus four silicon cap wafers 40 are utilized. Each of the cap wafers 40 is patterned with an appropriate cavity 15 and appropriate opening(s) 44 to seal individual sensors in particular environments needed by the individual sensor. FIG. 2d shows a cap wafer 40 with a single cavity 15 and an opening 44 therein (located between the cavity 15 and an end wall 51) positioned so that when this particular cap wafer 40 is applied to the structure depicted by FIG. 2c, the cavity 15 therein will cover and seal the left most sensor (or device) $12_1$ shown in FIG. 2c and leave the remaining sensors (or devices) $12_2$-$12_4$ exposed through opening 44. Cavities 15 define the sealing environment (encapsulation) for typically a single sensor (or device) as each successive patterned cap wafer 40 is bonded into position on the ASIC wafer 30. The openings or holes 44 allow for a different environment when encapsulating of the other devices or sensors 12. The first sensor (or device) $12_1$ (a quartz clock, for example, in the embodiment of FIG. 1a) is sealed at some desired gas pressure $P_1$ in a desired gas $G_1$ through the bonding of the first patterned cap wafer $40_1$ to the ASIC wafer 30 at bond 43 forming the hermetically sealed cavity $15_1$ as shown in FIG. 2e.

Figure 1B:
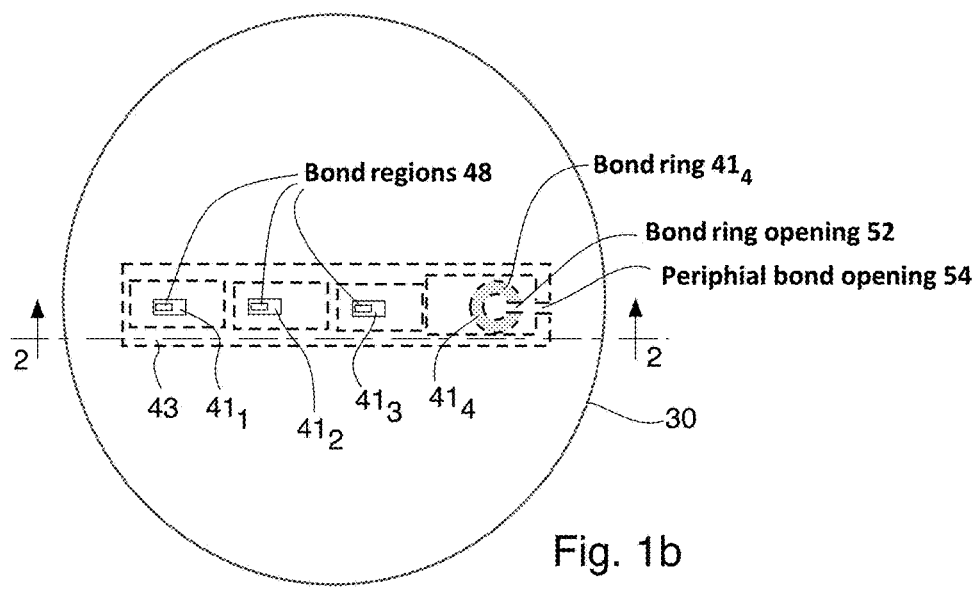
FIG. 1b is a cross section view thereof.

In FIG. 2e the height of the bond regions $41_1$-$41_4$ for the four sensors (or devices) $12_1$-$12_4$ in this embodiment and the height of the peripheral bond region 43 for the four cap wafers $40_1$-$40_4$ in this embodiment are exaggerated for ease of illustration. The peripheral bond region 43 is also shown in FIG. 1b by dashed lines. The peripheral bond region 43 preferably completely encircles each of the four sensors or devices $12_1$-$12_4$ except the last one ($12_4$) which is a preferably an ambient pressure detector and therefor needs a path 50 to ambient air. Therefore the pressure detector $12_4$ is only partially encircled by the peripheral bond region 43 in that there is preferably a break or opening in bond region 43 labeled by numeral 54. The end walls 51 of the four cap wafers $40_1$-$40_4$ each also preferably has an opening or notch 51N therein to provide the path 50 to ambient air from sensor $12_4$ through opening 52 and through the openings 54 and/or notches 51N.

Figure 2F:
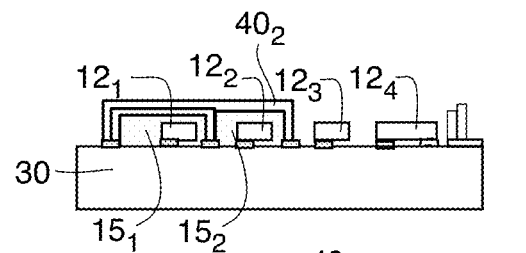
Figure 2G:
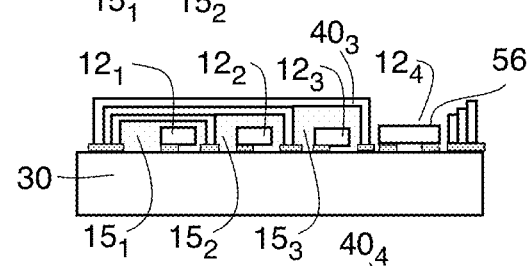
Figure 2H:
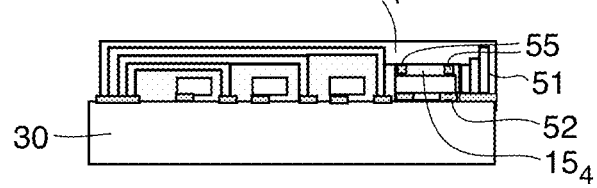
Figure 2I:
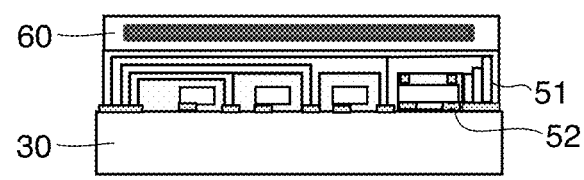
Figure 2J:
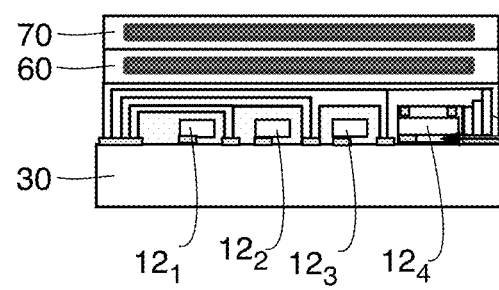

After the first sensor (or device) $12_1$ encapsulated within its cavity of cap wafer $40_1$, the second sensor $12_2$ (a quartz magnetometer, for example, in the embodiment of FIG. 1a) is then encapsulated at a gas pressure $P_2$ in ambient gas $G_2$ with the second patterned cap wafer $40_2$ at the peripheral bond 43 as shown in FIG. 2f. This process with successive cap wafers 40 (each with suitable cavities 15 and openings 44 defined therein) continues with the remaining sensors and cap wafers at their required environmental conditions being encapsulated preferably as shown by FIGS. 2g and 2h and bonded to layer 30 at, for example, bond the peripheral bond 43. The encapsulated pressure ($P_1$, $P_2$, etc.) may be 0, i.e., a vacuum and the gases $G_1$, and $G_2$, etc., if used, are preferably nitrogen and/or helium. The same gas (or a common vacuum) be used in two different encapsulations. So each encapsulated environment may have its own unique gas type and pressure, but, if desired, neighboring sensors or devices can share a unique gas type and pressure if desired.

In FIGS. 2f-2h each cap wafer 40 not only encapsulates a single sensor (or device) 12 with a desired gas at a desired pressure, but also re-encapsulates the previously encapsulated sensors (or devices) 12. Instead of having each successive cap wafer 40 re-encapsulate prior encapsulation(s), each successive cap wafer 40 may be formed instead to encapsulate only its associated sensor without also encapsulating any previous encapsulations as shown in FIG. 1a. Of course, various combinations of these two encapsulation techniques will suggest themselves to those skilled in the art.

The bonds $41_1$-$41_4$ and 43 are preferably formed as a thermo-compression metal bond but other bond techniques could alternatively be used especially if the bonds need to be made at lower than usual temperatures for thermo-compression bonding due to, for example, a temperature sensitivity of one or more of the sensors. The stoichiometry of the bonds 43 for each of the cap wafers 40 is preferably selected to achieve a hermetic seal of the encapsulated sensors $12_1$-$12_3$ within cavities 15.

The fourth device $12_4$ in this embodiment is preferably a pressure sensor which has a diaphragm 56 (see FIG. 2g) which is sealed around its perimeter by a perimeter seal 55 from above to define the cavity or chamber $15_4$ which preferably formed at the reference pressure of $P_{ref}$. Below the diaphragm 56 is located a air path 50 (see also FIG. 2e1) to ambient in the form of the missing segment 52 of the bond metal ring $41_4$ and the missing portion 54 in the peripheral bond 43 in combination with opening(s) and/or notch(es) 51N allows equalization of the pressure under the diaphragm 56 with the ambient pressure to be measured via the air path 50.

The pressure sensor $12_4$ of this embodiment measures a differential pressure difference across diaphragm 56. On one side of the diaphragm 56, the pressure is well defined (at a reference pressure $P_{ref}$) by the capping process of cap wafer $40_4$ under a controlled environment (gas and pressure) at seals 54. Alternatively, the damping unit 60 may be used as the final cap (see FIG. 1a). The final cap wafer $40_4$ in the embodiment of FIG. 2h utilizes a seal 54 at the edge of the cavity 15₄ thereby locking in that controlled environment between the diaphragm 56 and the cap. On the other side of the diaphragm 56, the gap or opening 52 in the seal ring 41₄ allows pressure to equalize to ambient pressure (via passage 50), which is the pressure to be measured.

Vibration isolation is desirable for many sensors and therefore a silicon wafer containing a vibration damping unit 60 is preferably bonded (see FIG. 2i) to the topmost cap 40 of the capped wafer stack shown in FIG. 2h. The vibration damping unit 60 may utilize a squeezed film or particles as the damping agent. The final component is preferably a gyroscope 70 which is bonded to the top of the vibration damping unit 60 (see FIG. 2j) to complete the encapsulation of the inertial navigation system. The vibration damping unit 60 is preferably bonded to the composite unit depicted in FIG. 2h providing a vibration-damped surface for receiving the gyroscope 70. The gyroscope 70 is mounted on the the vibration damping unit 60. The vibration damping unit 60 may be fabricated using standard MEMS fabrications techniques. Preferred materials for the composite unit include semiconductors (silicon, etc.), dielectrics (silicon dioxide, silicon nitride, etc.), metals (aluminum, gold, titanium, etc.) and polymers (polyamide, etc.).

The vibration damping unit 60 in some embodiments may be located under the ASIC wafer 30 (as viewed in FIG. 1a) instead of (or in addition to) on top of the encapsulated sensors 12 if none of the sensors is an accelerometer, for example.

The gyroscope 70, the damper 60 and the sensors 12 may be all enclosed within a rounded shell 72 as depicted by FIG. 1a if desired. Of course, the shell 72 may assume some other geometric shape (square, rectangular, etc.).

As can be seen with reference to FIG. 1a, sensor or device 12₁ may serve as a resonator for a clock, while sensor or device 12₂ may be magnetometer while sensor or device 12₃ may be an accelerometer in order to form an INS as mentioned above. The sensors and devices 12₁-12₄ may perform other or additional tasks if desired.

This method may utilize quartz processing techniques described in U.S. Pat. No. 7,237,315 to make quartz based sensors 12.

This concludes the description of embodiments of the present invention. The foregoing description of these embodiments and methods of making same have been presented for the purposes of illustration and description. It is not intended to be exhaustive or to limit the invention to the precise form or methods disclosed. Many modifications and variations are possible in light of the above teachings. It is intended that the scope of the invention be limited not by this detailed description, but rather by the claims appended hereto.

What is claimed is:

1. An apparatus comprising a sensor suite comprising several sensors each having quartz members formed of quartz from a common body of quartz material; said sensors being disposed on a single wafer and where each sensor is sealed in a distinct pressure and/or a distinct gaseous environment, the sensor suite further comprising a plurality of cap wafers sealing said sensors in said distinct pressure and/or gaseous environments, at least two of said cap wafers overlapping other ones of said cap wafers; and a vibration damping unit adhered to at least one of said caps in said plurality of caps.

2. The apparatus of claim 1 wherein each of said cap wafers has a depending sidewall which surrounds at least one of said sensors and which is bonded to said single wafer to thereby hermetically seal said at least one of said sensors.

3. The apparatus of claim 1 further including a gyroscope adhered to a side of said vibration damping unit remote from said plurality of caps.

4. The apparatus of claim 1 wherein at least one of said cap wafers has a depending sidewall which surrounds one of said sensors and which is bonded to said single wafer to thereby hermetically seal said one of said sensors.

5. The apparatus of claim 4 wherein at least another one of said cap wafers has a depending sidewall which at least partially surrounds another one of said sensors, the depending sidewall of said at least another one of said cap wafers has an opening therein for venting at least a portion of said another one of said sensors to ambient.

6. A device comprising:
a single IC wafer;
a plurality of sensors bonded to bond regions on said single IC wafer, at least one of said bond regions including an opening therein in gaseous communication with a pressure chamber associated with at least one of the plurality of said sensors;
a plurality of caps hermetically encapsulating all or at least a portion of said plurality of sensors, at least one of said plurality of caps forming at least a portion of said pressure chamber; and
a monolithic vibration damping unit adhered to at least one of said caps in said plurality of caps.

7. The device of claim 6 wherein a majority of said cap wafers are disposed in an overlapping relationship with one or more other ones of said cap wafers.

8. A device comprising:
a single IC wafer;
a plurality of sensors bonded to bond regions on said single IC wafer;
a plurality of caps hermetically encapsulating all or at least a portion of said plurality of sensors, at least one of said plurality of caps forming at least a portion of a pressure chamber; and
a damping unit adhered to at least one of said plurality of caps.

9. The device of claim 8 further including a gyroscope disposed on a side of said damping unit remote from said caps.

10. The device of claim 8 wherein:
(a) said vibration damping unit is a monolithic vibration damping unit;
(b) one of said encapsulating caps encapsulates (i) one or more of said sensors and/or devices and (ii) another one or ones of said encapsulating caps in a separate fluid or vacuum environment remote from said plurality of caps; and
(c) said monolithic vibration damping unit is disposed on said one of said encapsulating caps.

11. The device of claim 8 wherein said damping unit comprises a squeezed film.

12. The device of claim 11 wherein said plurality of caps are adhered to additional bond regions on said single IC wafer at least one of said additional bond regions includes an opening therein in gaseous communication with said pressure chamber which is associated with at least one of the plurality of said sensors.

13. The device of claim 12 wherein said at least one of said sensors is associated with said bond regions having an opening therein is a pressure detecting device in fluid communication with said opening and wherein the remaining ones of said sensors are selected from the group consisting: magnetometers, accelerometers and resonators.

14. The device of claim 12 wherein said sensors are formed from a common wafer of quartz.

15. The device of claim 14 wherein all of said sensors have a common crystallographic orientation based on the common wafer of quartz from which they are formed.

16. A device comprising:
a. an integrated circuit chip or wafer;
b. a plurality of sensors and/or devices disposed on said integrated circuit chip or wafer;
c. a plurality of encapsulating caps disposed over said sensors and/or devices, each of said plurality of encapsulating caps being affixed directly to said integrated circuit chip or wafer and encapsulating one or more of said sensors and/or devices with a separate fluid or vacuum environment;
d. a damping material adhered on one side thereof to at least one of said plurality of encapsulating caps; and
e. a gyroscope adhered to another side of said damping material.

17. The device of claim 16 wherein each and every one of said sensors and/or devices is at least partially encapsulated with a unique gaseous pressure and/or a unique gaseous material.

18. The device of claim 16 wherein at least one of said sensors and/or devices is encapsulated with a unique gaseous pressure and/or a unique gaseous material compared with other ones of said sensors and/or devices.

19. The device of claim 16 wherein a vibration damping unit is bonded to at least one of said caps and wherein an accelerometer is disposed on a side of said vibration damping unit spaced from said at least one of said caps.

20. The device of claim 16 wherein said sensors and/or devices are formed from a quartz wafer.

21. The device of claim 16 wherein each of said encapsulating caps has a depending sidewall which surrounds at least one of said plurality of sensors and which is bonded to said integrated circuit chip or wafer to thereby hermetically seal said at least one of said plurality of sensors.

22. The device of claim 16 wherein at least one of said encapsulating caps encapsulates (i) one or more of said sensors and/or devices and (ii) another one or ones of said encapsulating caps in a separate fluid or vacuum environment.

23. The device of claim 16 wherein at least one of said encapsulating caps has a depending sidewall which surrounds one of said plurality of sensors and which is bonded to said integrated circuit chip or wafer to thereby hermetically seal said one of said plurality of sensors.

24. The apparatus of claim 23 wherein at least another one of said encapsulating caps has a depending sidewall which at least partially surrounds another one of said plurality of sensors, the depending sidewall of said at least another one of said encapsulating caps has an opening therein for venting at least a portion of said another one of said plurality of sensors to ambient.

25. A device comprising:
a. an integrated circuit chip or wafer;
b. a plurality of sensors and/or devices disposed on said integrated circuit chip or wafer;
c. encapsulating caps disposed over said sensors and/or devices, each encapsulating cap encapsulating one or more of said sensors and/or devices with a separate fluid or vacuum environment for each of said plurality of sensors and/or devices;
d. a vibration damping unit adhered to each of said plurality of caps;
wherein exposed surfaces of said sensors and/or devices are affixed to bond regions on said integrated circuit chip or wafer and wherein at least one of said bond regions has a opening therein which helps form a fluid communication passage associated with a given one of said sensor or devices, the given one of said sensor or devices comprising a pressure detector, the pressure detector confronting two chambers for measuring a differential pressure across said two chambers, said fluid communication channel being in fluid communication with one of said two chambers.

26. An apparatus comprising a sensor suite in which a plurality of sensors are disposed on a single substrate and wherein said sensors are sealed in distinct pressure and/or a distinct gaseous environments by means of a plurality of caps, each of said plurality of caps being affixed to said single substrate and sealing one or more of said plurality of sensors in said distinct pressure and/or gaseous environment and a silicon wafer containing a vibration damping unit bonded to at least one of said plurality of caps.

27. The apparatus of claim 26 wherein at least one of said caps seals one or more of said sensors and/or devices and also seals another one or ones of said caps in a common separate fluid or vacuum environment.

* * * * *